(12) United States Patent
Yanagita

(10) Patent No.: US 12,349,385 B2
(45) Date of Patent: Jul. 1, 2025

(54) SEMICONDUCTOR DEVICE, ELECTRIC CIRCUIT, AND WIRELESS COMMUNICATION APPARATUS

(71) Applicant: SONY SEMICONDUCTOR SOLUTIONS CORPORATION, Kanagawa (JP)

(72) Inventor: Masashi Yanagita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 450 days.

(21) Appl. No.: 17/756,004

(22) PCT Filed: Nov. 13, 2020

(86) PCT No.: PCT/JP2020/042418
§ 371 (c)(1),
(2) Date: May 13, 2022

(87) PCT Pub. No.: WO2021/100625
PCT Pub. Date: May 27, 2021

(65) Prior Publication Data
US 2022/0416065 A1    Dec. 29, 2022

(30) Foreign Application Priority Data
Nov. 21, 2019  (JP) ................... 2019-210559

(51) Int. Cl.
| | |
|---|---|
| H01L 29/20 | (2006.01) |
| H10D 30/01 | (2025.01) |
| H10D 30/47 | (2025.01) |
| H10D 62/13 | (2025.01) |

(Continued)

(52) U.S. Cl.
CPC .......... H10D 30/47 (2025.01); H10D 30/015 (2025.01); H10D 62/151 (2025.01); H10D 62/824 (2025.01); H10D 62/8503 (2025.01)

(58) Field of Classification Search
None
See application file for complete search history.

(56) References Cited

U.S. PATENT DOCUMENTS

| | | | |
|---|---|---|---|
| 2003/0141518 A1* | 7/2003 | Yokogawa | ........... H01L 21/8252 257/E27.012 |
| 2011/0284865 A1* | 11/2011 | Inoue | ................... H01L 29/0843 257/E21.403 |

FOREIGN PATENT DOCUMENTS

| | | |
|---|---|---|
| CN | 1476638 A | 2/2004 |
| EP | 1344256 A2 | 9/2003 |
| JP | 2002-222817 A | 8/2002 |

(Continued)

OTHER PUBLICATIONS

JP20009054807 english translation (Year: 2009).*

(Continued)

*Primary Examiner* — Bradley Smith
(74) *Attorney, Agent, or Firm* — CHIP LAW GROUP

(57) ABSTRACT

A semiconductor device includes a channel layer, a barrier layer, and at least one contact layer. The channel layer includes a GaN-based material. The barrier layer includes an AlInN-based material in which a composition ratio of In is higher than 18%, and is provided on the channel layer. The at least one contact layer includes a conductive-type semiconductor material and is provided to penetrate the barrier layer and reach the channel layer.

15 Claims, 12 Drawing Sheets

(51) Int. Cl.
*H10D 62/824* (2025.01)
*H10D 62/85* (2025.01)

(56) References Cited

FOREIGN PATENT DOCUMENTS

| | | |
|---|---|---|
| JP | 2009-054807 A | 3/2009 |
| JP | 2015-159307 A | 9/2015 |
| JP | 2015-192004 A | 11/2015 |
| JP | 2018-206994 A | 12/2018 |
| WO | 2002/043156 A2 | 5/2002 |
| WO | 2010/074275 A1 | 7/2010 |

OTHER PUBLICATIONS

JP2015159307A. english translation (Year: 2015).*
JP2015192004A english translation (Year: 2015).*
International Search Report and Written Opinion of PCT Application No. PCT/JP2020/042418, issued on Feb. 2, 2021, 10 pages of ISRWO.

* cited by examiner

[FIG. 1]
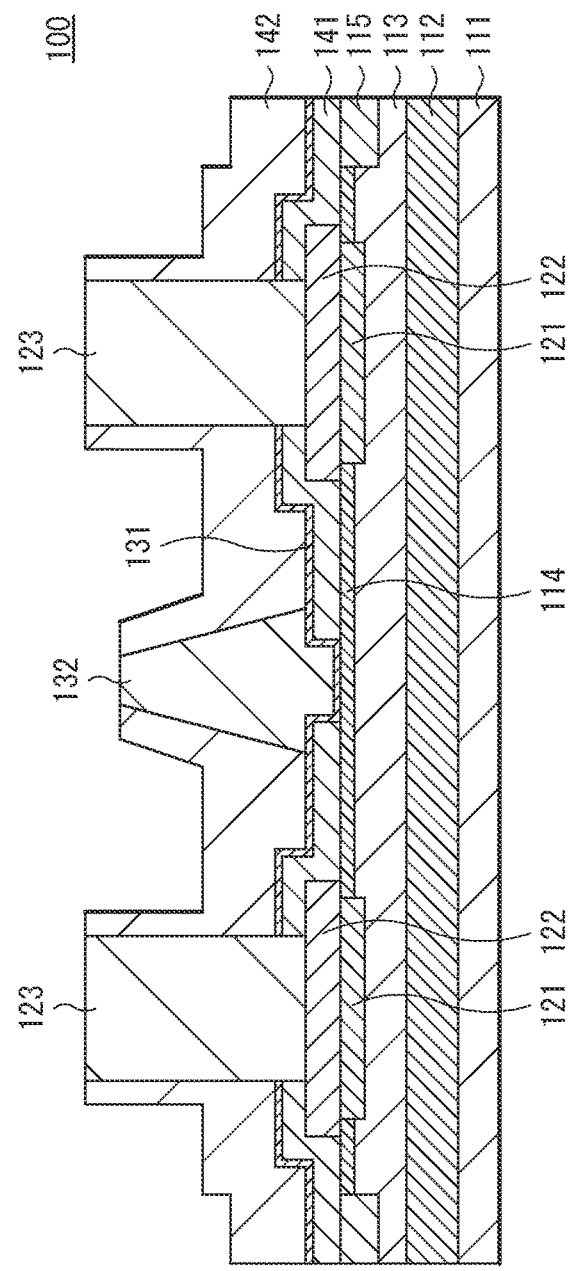

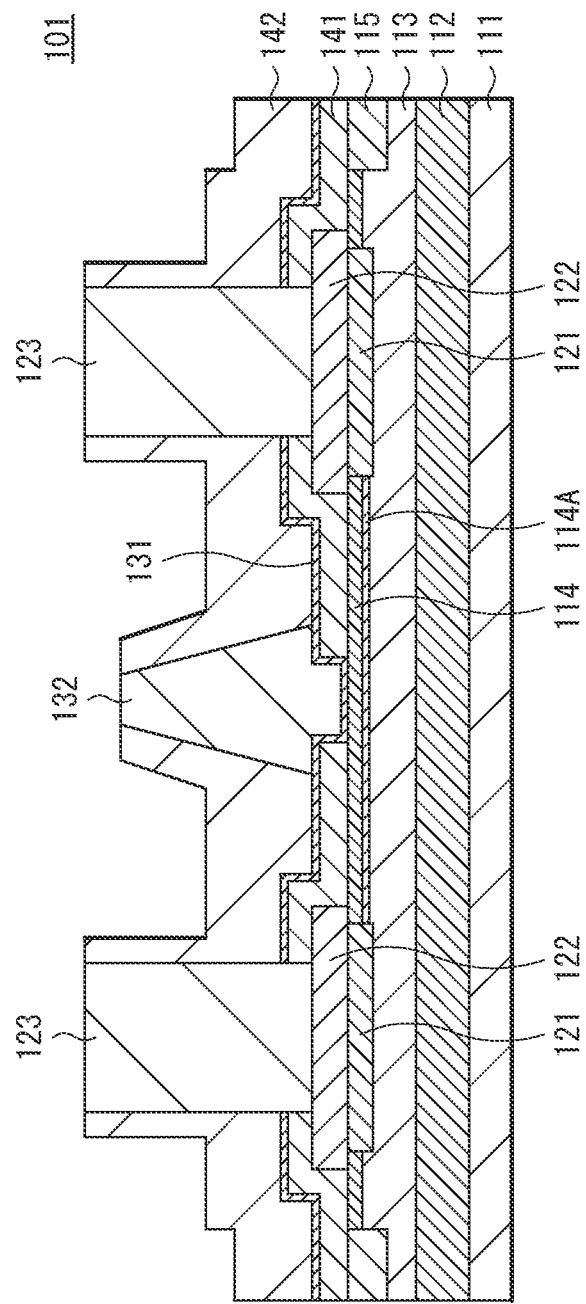
[FIG. 2A]

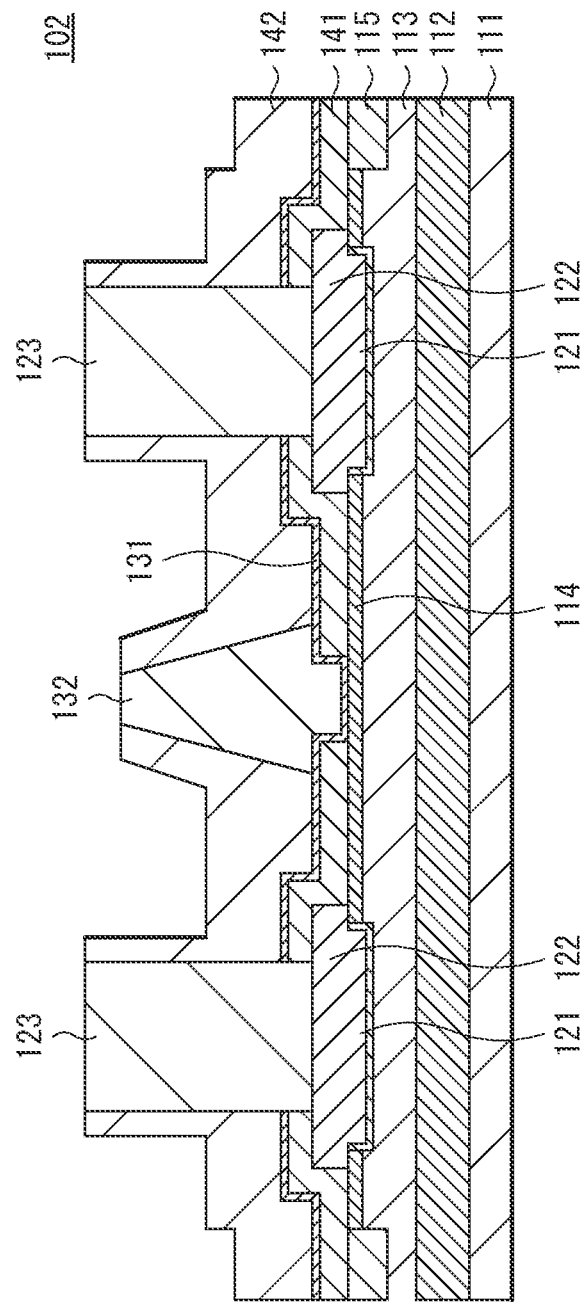
[FIG. 2B]

[FIG. 3]
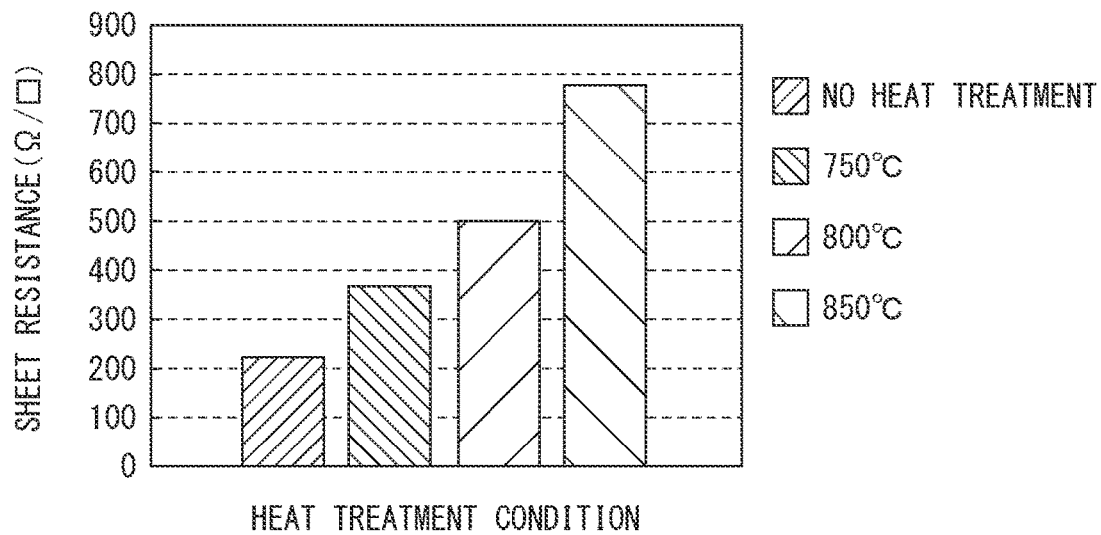
[FIG. 4]
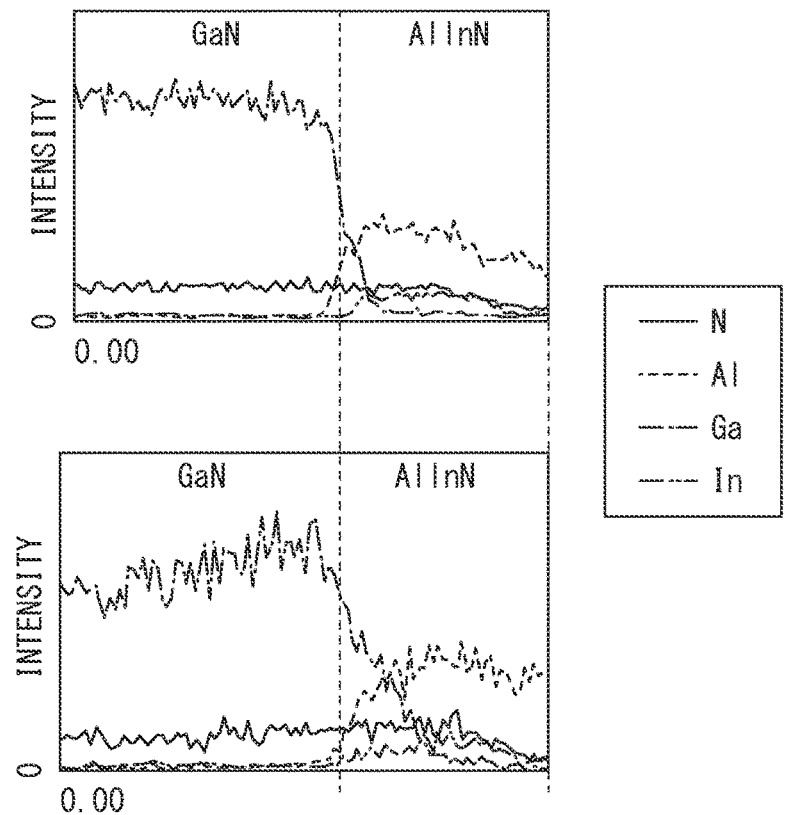

[FIG. 5]
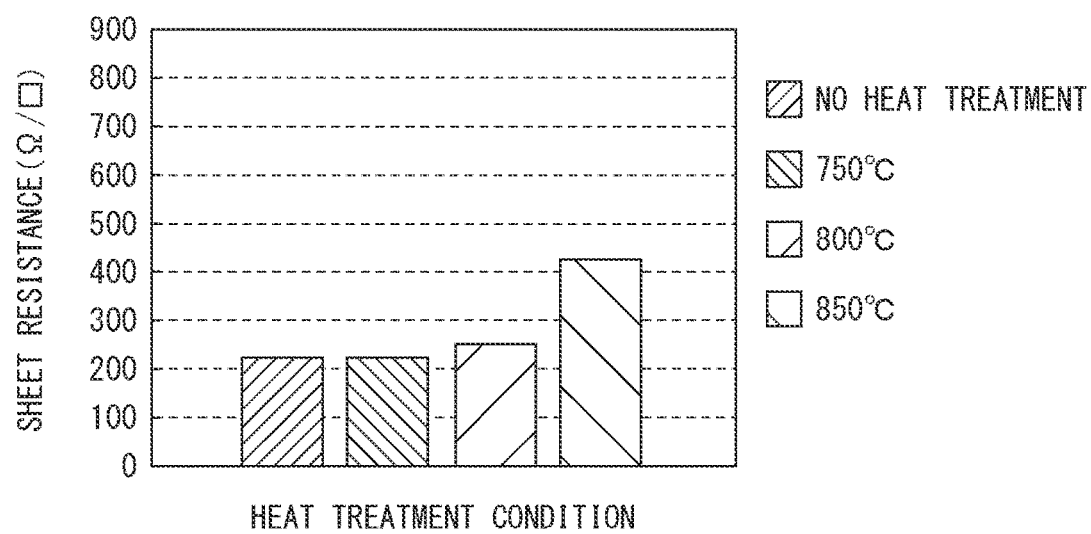

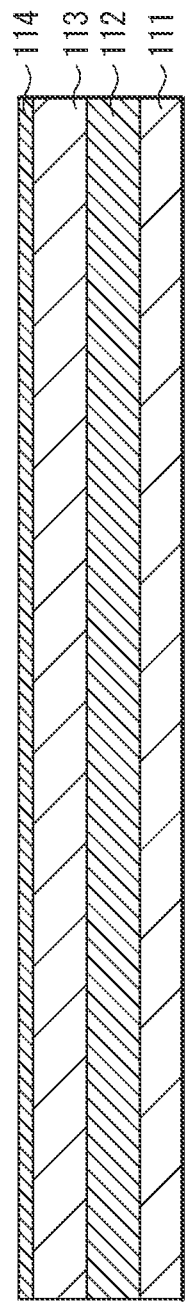
[FIG. 6]

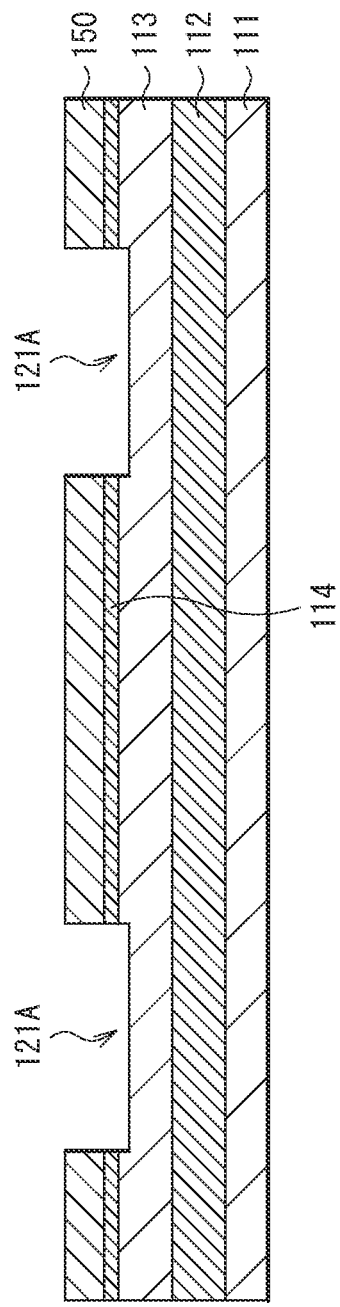
[ FIG. 7 ]

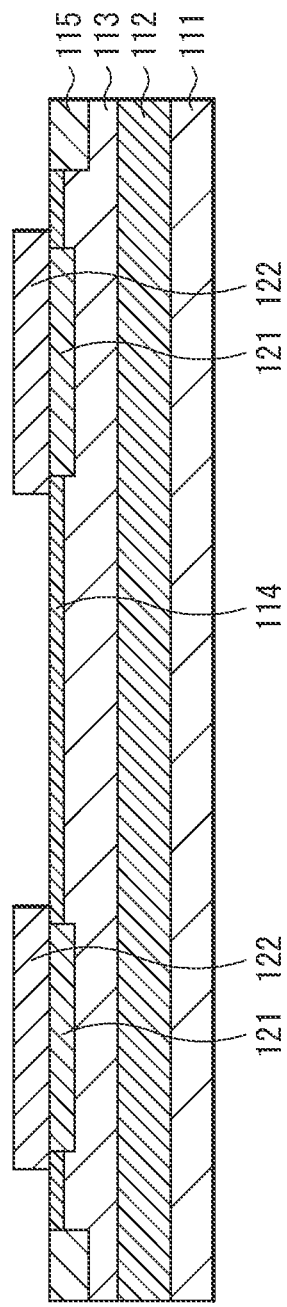

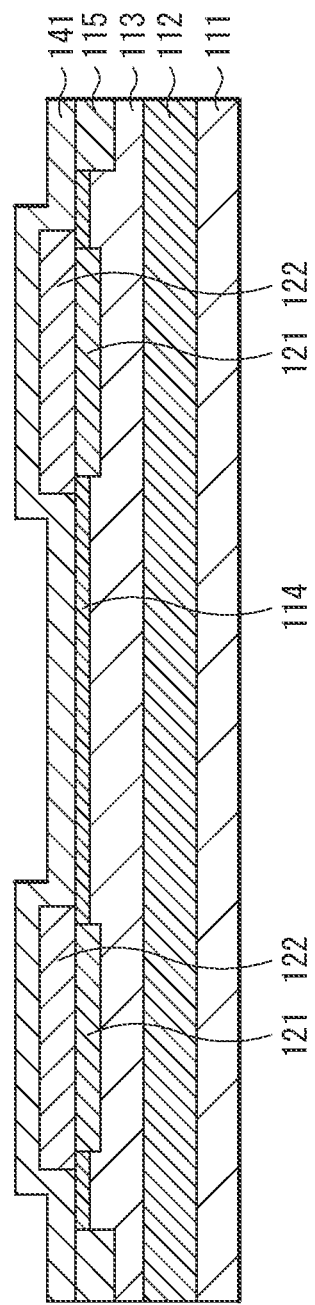
[FIG. 9]

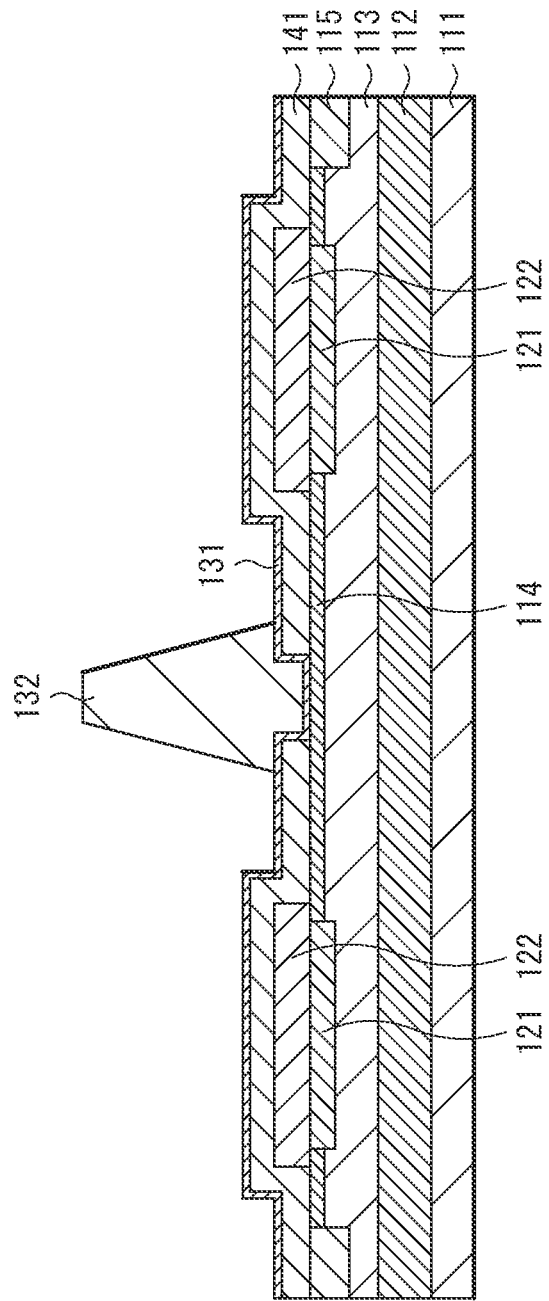
[FIG. 10]

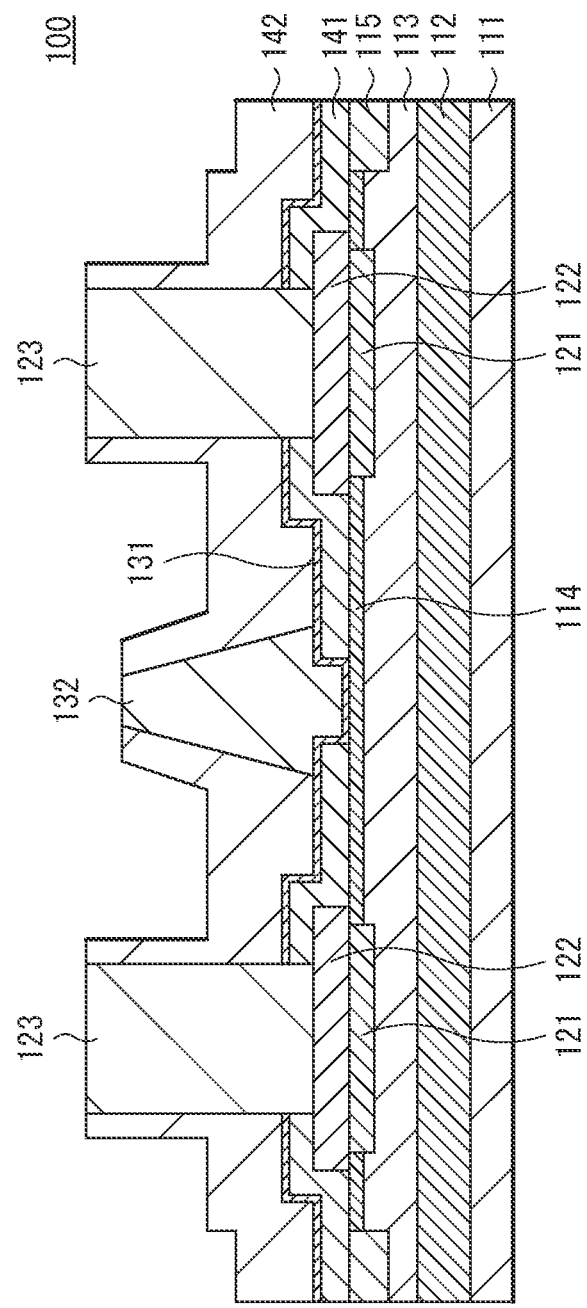
[FIG. 11]

[FIG. 12]
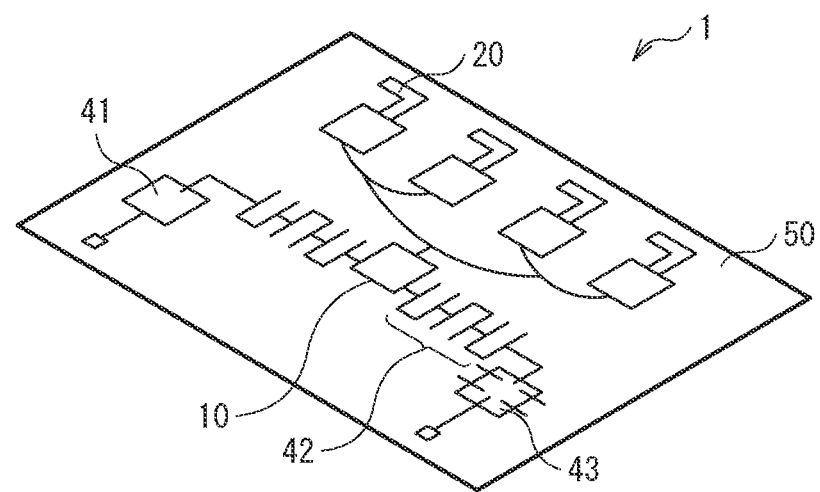
[FIG. 13]
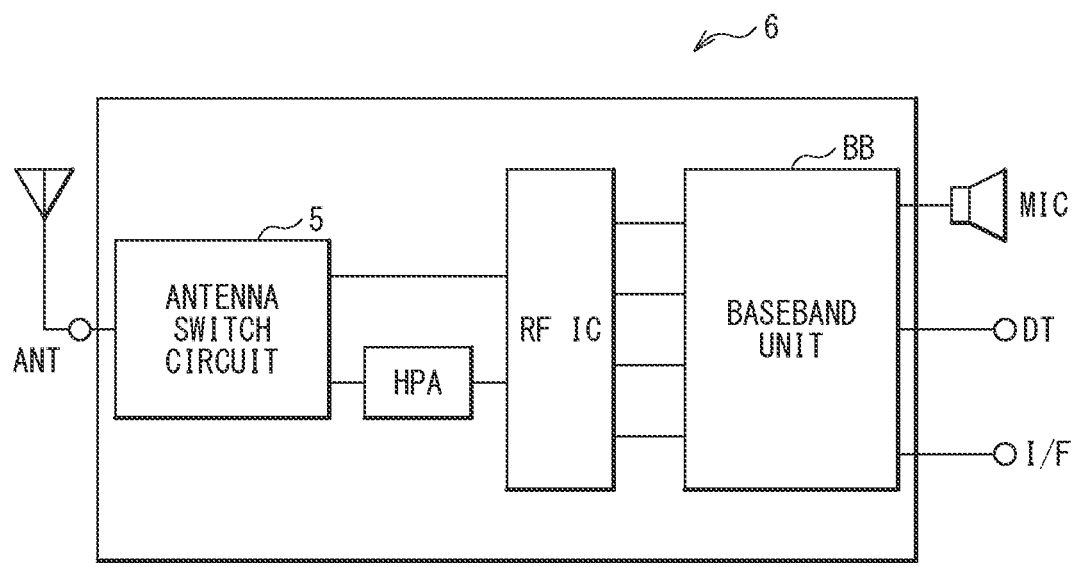

SEMICONDUCTOR DEVICE, ELECTRIC CIRCUIT, AND WIRELESS COMMUNICATION APPARATUS

CROSS REFERENCE TO RELATED APPLICATIONS

This application is a U.S. National Phase of International Patent Application No. PCT/JP2020/042418 filed on Nov. 13, 2020, which claims priority benefit of Japanese Patent Application No. JP 2019-210559 filed in the Japan Patent Office on Nov. 21, 2019. Each of the above-referenced applications is hereby incorporated herein by reference in its entirety.

TECHNICAL FIELD

The present disclosure relates to a semiconductor device, an electric circuit, and a wireless communication apparatus.

BACKGROUND ART

Recently, a high electron mobility transistor (High Electron Mobility Transistor: HEMT) using a heterojunction of compound semiconductors has been developed (for example, PTL 1). As compared with other transistors, the HEMT has high resistance to voltage, high resistance to heat, a high saturation electron velocity, and a high channel electron density. Therefore, its application to a device such as a power device or a high-frequency device which requires a smaller size and a higher performance has been considered.

The HEMT is a transistor using, as a channel, two-dimensional electron gas formed at an interface between a channel layer and a barrier layer that include compound semiconductors different from each other. In the HEMT, in order to form a favorable ohmic contact to the channel, the barrier layer having a high potential barrier is removed and a contact layer having high conductivity is regrown in a source or drain region.

CITATION LIST

Patent Literature

PTL 1: Japanese Unexamined Patent Application Publication No. 2018-206994

SUMMARY OF THE INVENTION

In such a HEMT, it is desired, in a process of regrowing a contact layer, to prevent degradation in characteristics of a channel layer and a barrier layer formed earlier. That is, it is desired to form a contact layer having a favorable contact characteristic while suppressing an increase in sheet resistance of a channel formed at an interface between the channel layer and the barrier layer.

Therefore, it is desirable to provide a semiconductor device including a HEMT in which a channel has a low seat resistance and a contact layer has a low contact resistance, an electric circuit including such a semiconductor device, and a wireless communication apparatus including such a semiconductor device.

A semiconductor device according to an embodiment of the present disclosure includes a channel layer, a barrier layer, and at least one contact layer. The channel layer includes a GaN-based material. The barrier layer includes an AlInN-based material in which a composition ratio of In is higher than 18%, and is provided on the channel layer. The at least one contact layer includes a conductive-type semiconductor material and is provided to penetrate the barrier layer and reach the channel layer.

Further, a semiconductor device according to another embodiment of the present disclosure includes a channel layer, a spacer layer, a barrier layer, and at least one contact layer. The channel layer includes a GaN-based material. The spacer layer includes an AlN-based material and is provided on the channel layer. The barrier layer includes an AlInN-based material in which a composition ratio of In is higher than 18%, and is provided on the spacer layer. The at least one contact layer includes a conductive-type semiconductor material and is provided to penetrate the barrier layer and the spacer layer and reach the channel layer.

Further, an electric circuit according to another embodiment of the present disclosure includes a semiconductor device. The semiconductor device includes a channel layer, a barrier layer, and at least one contact layer. The channel layer includes a GaN-based material. The barrier layer includes an AlInN-based material in which a composition ratio of In is higher than 18%, and is provided on the channel layer. The at least one contact layer includes a conductive-type semiconductor material and is provided to penetrate the barrier layer and reach the channel layer.

Moreover, a wireless communication apparatus according to another embodiment of the present disclosure includes a semiconductor device. The semiconductor device includes a channel layer, a barrier layer, and at least one contact layer. The channel layer includes a GaN-based material. The barrier layer includes an AlInN-based material in which a composition ratio of In is higher than 18%, and is provided on the channel layer. The at least one contact layer includes a conductive-type semiconductor material and is provided to penetrate the barrier layer and reach the channel layer.

According to the semiconductor device, the electric circuit, and the wireless communication apparatus each according to an embodiment of the present disclosure, provided are the channel layer including the GaN-based material, the barrier layer including the AlInN-based material in which the composition ratio of In is higher than 18%, and at least one contact layer including the conductive-type semiconductor material and provided to penetrate the barrier layer and reach the channel layer. Accordingly, it is possible for the semiconductor device, the electric circuit, and the wireless communication apparatus each according to the present embodiment to improve heat resistance of a stack structure of the channel layer and the barrier layer, for example.

BRIEF DESCRIPTION OF DRAWINGS

FIG. 1 is a vertical cross-sectional view of a cross-sectional configuration of a semiconductor device according to an embodiment of the present disclosure.

FIG. 2A is a vertical cross-sectional view of a cross-sectional configuration of a semiconductor device according to a first modification of the embodiment.

FIG. 2B is a vertical cross-sectional view of a cross-sectional configuration of a semiconductor device according to a second modification of the embodiment.

FIG. 3 is a graph illustrating an example of temperature dependency of sheet resistance of a channel in a HEMT in which a spacer layer including AlN and a barrier layer including $Al_{0.83}In_{0.17}N$ are stacked on a channel layer including GaN.

FIG. 4 is a graph illustrating comparison, between before and after a heat treatment, of an example of element distribution in a stacking direction of a HEMT in which a spacer layer including AlN and a barrier layer including $Al_{0.83}In_{0.17}N$ are stacked on a channel layer including GaN.

FIG. 5 is a graph illustrating an example of temperature dependency of sheet resistance of a channel in a HEMT in which a spacer layer including AlN and a barrier layer including $Al_{0.81}In_{0.19}N$ are stacked on a channel layer including GaN.

FIG. 6 is a vertical cross-sectional view for describing a process of a method of manufacturing the semiconductor device according to the embodiment.

FIG. 7 is a vertical cross-sectional view for describing a process of the method of manufacturing the semiconductor device according to the embodiment.

FIG. 8 is a vertical cross-sectional view for describing a process of the method of manufacturing the semiconductor device according to the embodiment.

FIG. 9 is a vertical cross-sectional view for describing a process of the method of manufacturing the semiconductor device according to the embodiment.

FIG. 10 is a vertical cross-sectional view for describing a process of the method of manufacturing the semiconductor device according to the embodiment.

FIG. 11 is a vertical cross-sectional view for describing a process of the method of manufacturing the semiconductor device according to the embodiment.

FIG. 12 is a schematic perspective view for describing a wireless communication apparatus which is a first application example of the semiconductor device according to the embodiment.

FIG. 13 is a block diagram for describing a wireless communication apparatus which is a second application example of the semiconductor device according to the embodiment.

MODES FOR CARRYING OUT THE INVENTION

Some embodiments of the present disclosure are described below in detail with reference to the drawings. The embodiments described below are specific examples of the present disclosure, and the technology related to the present disclosure is not limited to the following embodiments. In addition, arrangements, dimensions, dimension ratios, etc. of respective components of the present disclosure are not limited to the embodiments illustrated in respective drawings.

It is to be noted that the description is given in the following order.

1. Configuration of Semiconductor Device
2. Working and Effects
3. Method of Manufacturing Semiconductor Device
4. Application Examples of Semiconductor Device <1. Configuration of Semiconductor Device>

First, referring to FIG. 1, a description is given of a configuration of a semiconductor device according to an embodiment of the present disclosure. FIG. 1 is a vertical cross-sectional view of a cross-sectional configuration of a semiconductor device 100 according to the present embodiment.

As illustrated in FIG. 1, the semiconductor device 100 according to the present embodiment includes a substrate 111, a buffer layer 112, a channel layer 113, a barrier layer 114, an element isolation layer 115, a contact layer 121, a source or drain electrode 122, a wiring layer 123, a dielectric film 131, a gate electrode 132, a first insulating layer 141, and a second insulating layer 142. The semiconductor device 100 is, for example, a high electron mobility transistor (HEMT) using, as a channel, high-mobility two-dimensional electron gas formed at an interface between the channel layer 113 and the barrier layer 114.

The substrate 111 is a substrate that supports each configuration of the semiconductor device 100. For example, the substrate 111 may be a single-crystal substrate of GaN which is a III-V compound semiconductor having a semi-insulating property. In a case where the substrate 111 includes the above-described compound semiconductor, a lattice constant of the substrate 111 and that of the channel layer 113 substantially match each other. Therefore, it is possible to cause epitaxial growth of the channel layer 113 on the substrate 111 even without providing the buffer layer 112 which will be described later. Alternatively, the substrate 111 may be a substrate including Si, SiC, sapphire, or the like having a lattice constant different from that of the channel layer 113. In such a case, it is possible to cause the epitaxial growth of the channel layer 113 on the substrate 111 by controlling, with use of the later-described buffer layer 112, the lattice constant of a surface on which the channel layer 113 is to be formed.

The buffer layer 112 is a compound semiconductor layer formed on the substrate 111 by epitaxial growth, and is provided to make crystal quality of the channel layer 113 more favorable. Specifically, the buffer layer 112 is able to make the crystal quality of the channel layer 113 more favorable by causing the lattice constant of the surface on which the channel layer 113 is to be formed to substantially match the lattice constant of the channel layer 113. Further, the buffer layer 112 is able to suppress warpage of the substrate 111 after the formation of the channel layer 113, by solving the lattice-constant mismatch between the substrate 111 and the channel layer 113. For example, in a case where the substrate 111 is a single-crystal Si substrate and the channel layer 113 includes GaN, the buffer layer 112 may include a single-layer film or a stack film of a plurality of layers that includes at least one of AlN, AlGaN, or GaN.

The channel layer 113 is a compound semiconductor layer formed on the buffer layer 112 by epitaxial growth, and forms a portion of a current path between the source or drain electrodes 122 provided on two respective sides of the gate electrode 132 with the gate electrode 132 interposed therebetween. Specifically, carriers (e.g., electrons) are accumulated at the interface of the channel layer 113 on a side of the barrier layer 114 due to a difference in polarization charge amount between the channel layer 113 and the barrier layer 114. Thus, at the interface of the channel layer 113 on the side of the barrier layer 114, two-dimensional electron gas is formed which allows the carriers to move with high mobility and functions as a channel of the semiconductor device 100. For example, the channel layer 113 may be an epitaxially grown layer of a GaN-based material.

In addition, the channel layer 113 may also be provided as an undoped layer into which a conductive-type impurity is not introduced. In such a case, impurity scattering of the carriers in the channel layer 113 is suppressed. This makes it possible for the carriers accumulated in the channel layer 113 to move with higher mobility.

The barrier layer 114 is a compound semiconductor layer formed on the channel layer 113 by epitaxial growth, and accumulates carriers at the interface of the channel layer 113 on the side of the barrier layer 114 due to the difference in polarization charge amount between the channel layer 113 and the barrier layer 114. Specifically, in the semiconductor device 100 according to the present embodiment, the barrier layer 114 is an epitaxially grown layer of an AlInN-based material in which a composition ratio of In is higher than 18%. In other words, the barrier layer 114 is an epitaxially grown layer including $Al_{1-x}In_xN$ ($0.18<x<1$).

In a case where the composition ratio of In is higher than 18%, heat resistance of a stack structure of the channel layer 113 and the barrier layer 114 improves. Accordingly, it is possible to suppress an increase in sheet resistance of a channel formed in the channel layer 113 caused by heat generated in a process of forming the contact layer 121 which will be described later. Specifically, in the case where the composition ratio of In is higher than 18%, it can be considered that interdiffusion of Ga atoms and In atoms between the barrier layer 114 and the channel layer 113 is suppressed. This suppresses unclearness of the heterojunction interface between the barrier layer 114 and the channel layer 113. Therefore, the semiconductor device 100 is able to suppress the increase in sheet resistance of the channel formed in the channel layer 113 by maintaining the difference in polarization charge amount between the barrier layer 114 and the channel layer 113.

The composition ratio of In in the AlInN-based material included in the barrier layer 114 may be preferably 20% or lower. In a case where the composition ratio of In is 20% or lower, the difference in polarization charge amount between the channel layer 113 and the barrier layer 114 has a sufficient value. Therefore, the sheet resistance of the channel formed in the channel layer 113 is further reduced. In addition, the mismatch between the lattice constant of the channel layer 113 and that of the barrier layer 114 is further reduced. Therefore, it is possible to keep more favorable crystal quality of the barrier layer 114.

Note that as long as carriers are allowed to be accumulated at the interface between the channel layer 113 and the barrier layer 114, the barrier layer 114 may be formed as an epitaxially grown layer of $Al_{1-x-y}In_xGa_yN$ (where $0.18<x<1$, $0\leq y<0.82$, and $x+y<1$). In addition, the barrier layer 114 may be formed as an epitaxially grown layer of $Al_{1-x-y}In_xGa_yN$ (where $0.18<x<1$, $0\leq y<0.82$, and $x+y<1$) in which no impurity is added (that is, undoped). In such cases, the barrier layer 114 is able to suppress the impurity scattering of the carriers in the channel layer 113. Therefore, it is possible to cause the carriers accumulated in the channel layer 113 to move with higher mobility.

The element isolation layer 115 is a layer including an insulating material, and electrically insulates the semiconductor device 100 from another semiconductor device. Specifically, the element isolation layer 115 may be formed by introducing boron (B) into a predetermined region of the channel layer 113 and the barrier layer 114 to increase resistance of the channel layer 113 and the barrier layer 114 in that region. Alternatively, the element isolation layer 115 may be formed by removing the channel layer 113 and the barrier layer 114 in a predetermined region by etching or the like and thereafter filling that region with an insulating material such as $SiO_2$.

The contact layer 121 is a conductive-type compound semiconductor layer provided to penetrate the barrier layer 114 and reach the channel layer 113. The contact layers 121 are provided on two respective sides of the gate electrode 132 with the gate electrode 132 interposed therebetween, corresponding to the source or drain electrodes 122. For example, it is possible to form the contact layer 121 by epitaxially growing a compound semiconductor layer in an opening provided by removing the barrier layer 114 and a portion of the channel layer 113, and thereafter introducing a conductive-type impurity into the compound semiconductor layer.

In the semiconductor device 100 according to the present embodiment, by improving the heat resistance of the stack structure of the channel layer 113 and the barrier layer 114, it is possible to suppress unclearness of the interface between the channel layer 113 and the barrier layer 114 caused by heat generated in epitaxially growing the contact layer 121. Accordingly, the semiconductor device 100 according to the present embodiment is able to suppress an increase in sheet resistance of a channel.

Providing the contact layer 121 in contact with the channel formed at the interface between the channel layer 113 and the barrier layer 114 makes it possible to form a current path from the source or drain electrode 122 to the channel. Specifically, the contact layer 121 may penetrate the barrier layer 114 and be provided to a region deeper than the interface between the channel layer 113 and the barrier layer 114. For example, the contact layer 121 may be provided in a region at a depth within 100 nm from a surface, of the barrier layer 114, on an opposite side to a surface thereof on a side provided with the channel layer 113 (i.e., a surface, of the barrier layer 114, on a side of the source or drain electrode 122).

The contact layer 121 may be formed using the same compound semiconductor as the channel layer 113. For example, the contact layer 121 may be formed by introducing an n-type impurity (e.g., Si, Ge, or the like) at a high concentration into an epitaxially grown layer of the GaN-based material which is the same as the channel layer 113. This allows the contact layer 121 to reduce contact resistance from the source or drain electrode 122 to the channel. In order to sufficiently reduce the contact resistance of the contact layer 121, the concentration of the n-type impurity introduced into the contact layer 121 is preferably $1\times10^{19}$ $cm^{-3}$ or higher, and more preferably $2\times10^{20}$ $cm^{-3}$ or higher. In a case where the concentration of the n-type impurity introduced into the contact layer 121 is $2\times10^{20}$ $cm^{-3}$ or higher, the contact layer 121 is able to have sufficient conductivity because the carrier concentration in the contact layer 121 can be, for example, $8\times10^{19}$ $cm^{-3}$.

Note that in order to further reduce an influence, of the heat generated in the process of forming the contact layer 121, on the stack structure of the channel layer 113 and the barrier layer 114, the contact layer 121 may be formed using $In_zGa_{1-z}N$ ($0<z<1$) whose crystal growth is achievable at a lower temperature. In such a case also, introducing the n-type impurity (e.g., Si, Ge, or the like) at a high concentration allows the contact layer 121 to reduce the contact resistance from the source or drain electrode 122 to the channel.

The source or drain electrode 122 includes a conductive material, and is provided to be electrically coupled to the contact layer 121. This allows the source or drain electrode 122 to be electrically coupled, via the contact layer 121, to the channel formed at the interface between the channel layer 113 and the barrier layer 114. Specifically, the source or drain electrode 122 is provided on each of the contact layers 121 provided on two respective sides of the gate electrode 132 with the gate electrode 132 interposed therebetween. In this case, the source or drain electrode 122 provided on one side of the two sides with the gate electrode 132 interposed therebetween becomes a source electrode, and the source or drain electrode 122 provided on the other side of the two sides with the gate electrode 132 interposed therebetween becomes a drain electrode. For example, the source or drain electrode 122 may be formed by sequentially stacking titanium (Ti), aluminum (Al), nickel (Ni), and gold (Au) from a side of the contact layer 121.

The first insulating layer 141 is an insulator layer provided on the barrier layer 114 and the source or drain electrode 122. The first insulating layer 141 has an opening corresponding to the gate electrode 132. The dielectric film 131 and the gate electrode 132 are stacked on the barrier layer 114 through the opening of the first insulating layer 141 to form a MIS (Metal-Insulator-Semiconductor) gate structure. The first insulating layer 141 may be formed, for example, using an insulating material such as $SiO_2$, $Si_3N_4$, or $Al_2O_3$.

The dielectric film 131 is a film having an insulating property with respect to the barrier layer 114 and the gate electrode 132, and is provided between the barrier layer 114 and the gate electrode 132. Specifically, the dielectric film 131 is provided on the first insulating layer 141, and is sandwiched between the barrier layer 114 and the gate electrode 132 inside the opening provided in the first insulating layer 141. For example, the dielectric film 131 may be formed using an insulating material such as $SiO_2$, $Si_3N_4$, or $Al_2O_3$, or a high dielectric constant material such as $HfO_2$.

The gate electrode 132 includes a conductive material and is provided on the dielectric film 131. The gate electrode 132 forms the MIS gate structure together with the barrier layer 114 and the dielectric film 131 inside the opening provided in the first insulating layer 141. Causing the gate electrode 132 to form the MIS gate structure through the opening provided in the first insulating layer 141 makes it possible to control a gate width more easily. For example, the gate electrode 132 may be provided by stacking a plurality of metal materials, or may be formed by sequentially stacking nickel (Ni) and gold (Au) from the side of the dielectric film 131.

The second insulating layer 142 is an insulator layer provided on the first insulating layer 141 and the dielectric film 131. The second insulating layer 142 may be formed, for example, using an insulating material such as $SiO_2$, $Si_3N_4$, or $Al_2O_3$.

The wiring layer 123 includes a conductive material, and is provided on each of the source or drain electrodes 122. The wiring layer 123 electrically couples the source or drain electrode 122 to another element. For example, the wiring layer 123 may be formed by sequentially stacking titanium (Ti) and aluminum (Al), or by sequentially stacking titanium (Ti) and gold (Au).

Next, referring to FIGS. 2A and 2B, modifications of the semiconductor device 100 according to the present embodiment are described. FIG. 2A is a vertical cross-sectional view of a cross-sectional configuration of a semiconductor device 101 according to a first modification. FIG. 2B is a vertical cross-sectional view of a cross-sectional configuration of a semiconductor device 102 according to a second modification.

As illustrated in FIG. 2A, the semiconductor device 101 may further include a spacer layer 114A between the channel layer 113 and the barrier layer 114.

The spacer layer 114A is a compound semiconductor layer formed by epitaxial growth, and is provided between the channel layer 113 and the barrier layer 114. Specifically, the spacer layer 114A is formed, for example, using a binary compound such as AlN, and relaxes atomic diffusion from the barrier layer 114 including a ternary compound such as AlInN to the channel layer 113. This makes it possible for the spacer layer 114A to suppress unclearness of the heterojunction between the barrier layer 114 and the channel layer 113. Accordingly, the spacer layer 114A is able to further increase the carrier mobility of the channel formed at the interface between the spacer layer 114A and the channel layer 113.

The spacer layer 114A may include Ga or the like diffused from the channel layer 113. Further, the spacer layer 114A may include AlGaN in which Ga is intentionally added to an extent that a characteristic of the channel formed at the interface between the spacer layer 114A and the channel layer 113 is not degraded.

Note that in the semiconductor device 101 illustrated in FIG. 2A, the contact layer 121 is provided in contact with the channel formed at the interface between the spacer layer 114A and the channel layer 113, to thereby form a current path from the source or drain electrode 122 to the channel. Specifically, the contact layer 121 may penetrate the barrier layer 114 and the spacer layer 114A to be provided to a region deeper than the interface between the channel layer 113 and the spacer layer 114A. For example, the contact layer 121 may be provided in a region at a depth within 100 nm from a surface, of the barrier layer 114, on an opposite side to a surface thereof on a side provided with the spacer layer 114A (i.e., a surface, of the barrier layer 114, on the side of the source or drain electrode 122).

Further, as illustrated in FIG. 2B, in the semiconductor device 102, the contact layer 121 may be provided to cover a side surface and a bottom surface of the source or drain electrode 122.

For example, the contact layer 121 may be formed by uniformly epitaxially growing a compound semiconductor layer on a bottom surface and a side surface of an opening provided by removing the barrier layer 114 and a portion of the channel layer 113, and thereafter introducing a conductive-type impurity into the compound semiconductor layer. Further, the source or drain electrode 122 may be provided on the barrier layer 114 in such a manner as to fill the opening having the bottom surface and the side surface with the contact layer 121 formed thereon.

That is, the contact layer 121 is not particularly limited in film thickness or the like as long as the contact layer 121 electrically couples the channel, formed at the interface between the barrier layer 114 and the channel layer 113, and the source or drain electrode 122 to each other. Accordingly, as with the semiconductor device 100 illustrated in FIG. 1, in the semiconductor device 102 illustrated in FIG. 2B, the contact layer 121 is able to reduce the contact resistance between the channel, formed at the interface between the barrier layer 114 and the channel layer 113, and the source or drain electrode 122.

<2. Working and Effects>

Next, referring to FIGS. 3 to 5, working and effects of the semiconductor device 100 according to the present embodiment are described.

In a HEMT in which a GaN-based material is used for the channel layer 113, an AlInN-based material is used for the barrier layer 114, and a GaN-based material is used for the contact layer 121 as in the semiconductor device 100 according to the present embodiment, the composition ratio of In in the AlInN-based material included in the barrier layer 114 is typically about 17% to 18%. In such a case, it is possible to make the crystallinity of the barrier layer 114 more favorable because the lattice constant of the barrier layer 114 matches the lattice constant of the channel layer 113.

However, the AlInN-based material in which the composition ratio of In is about 17% to 18% has lower heat resistance. Therefore, in a case where the barrier layer 114 is exposed to a high temperature after the barrier layer 114 is stacked on the channel layer 113, a characteristic of the channel formed at the interface between the channel layer 113 and the barrier layer 114 may sometimes deteriorate.

Referring to FIGS. 3 and 4, the deterioration of the characteristic of the channel is described more specifically. FIG. 3 is a graph illustrating an example of temperature dependency of sheet resistance of a channel in a HEMT in which the spacer layer 114A including AlN and the barrier layer 114 including $Al_{0.83}In_{0.17}N$ are stacked on the channel layer 113 including GaN. FIG. 4 is a graph illustrating comparison, between before and after a heat treatment, of an example of element distribution in a stacking direction of the HEMT in which the spacer layer 114A including AlN and the barrier layer 114 including $Al_{0.83}In_{0.17}N$ are stacked on the channel layer 113 including GaN.

FIG. 4 illustrates a result of analyzing a ratio of each element from the side of the barrier layer 114 by EDX. A horizontal axis represents a depth in the stacking direction from the side of the barrier layer 114, and a vertical axis represents an existence ratio of each element. An upper graph in FIG. 4 illustrates elemental profile by EDX before the heat treatment, and a lower graph in FIG. 4 illustrates elemental profile by EDX after the heat treatment. Further, in FIG. 4, a description related to the spacer layer 114A including AlN is omitted because it is an extremely thin film of about 1 nm.

As is apparent from FIG. 3, in a case where the composition ratio of In in the AlInN-based material included in the barrier layer 114 is 18% or lower, the higher the temperature of the heat treatment is, the more the sheet resistance of the channel formed at the interface between the channel layer 113 and the barrier layer 114 increases.

It can be considered that this is because, as illustrated in FIG. 4, interdiffusion of atoms occurs between the channel layer 113 including GaN and the barrier layer 114 including AlInN due to the heat treatment, and the heterojunction interface between the channel layer 113 and the barrier layer 114 becomes unclear. It can b e considered that this decreases the carrier mobility of the channel formed at the interface between the channel layer 113 and the barrier layer 114, thereby causing an increase in sheet resistance of the channel. In addition, it can be considered that the carrier concentration of the two-dimensional electron gas which is to serve as the channel also decreases because the difference in polarization charge amount between the channel layer 113 and the barrier layer 114 is reduced.

Here, the contact layer 121 is formed by, for example, epitaxial growth at a high temperature using an MOCVD (Metal Organic Chemical Vapor Deposition) method or a PVD (Physical Vapor Deposition) method such as an MBE (Molecular Beam Epitaxy) method.

In a case where the temperature in the process of forming the contact layer 121 is low, crystallinity of the contact layer 121 is degraded, which easily results in a defect or a void. In such a case, it is difficult for the contact layer 121 to be appropriately in contact with the channel formed at the interface between the channel layer 113 and the barrier layer 114. This makes it difficult to reduce the contact resistance between the channel and the source or drain electrode 122.

Therefore, it has been difficult to achieve both favorable sheet resistance of the channel and favorable contact resistance of the contact layer 121 in the case where the composition ratio of In in the AlInN-based material included in the barrier layer 114 is about 17% to 18%.

In the semiconductor device 100 according to the present embodiment, the heat resistance of the stack structure of the channel layer 113 and the barrier layer 114 is improved by causing the composition ratio of In in the AlInN-based material included in the barrier layer 114 to be higher than 18%. It can be considered that this suppresses interdiffusion of atoms at the interface between the channel layer 113 and the barrier layer 114 even in a case where the channel layer 113 and the barrier layer 114 are exposed to a high temperature in the process of forming the contact layer 121. Accordingly, in the semiconductor device 100, it is possible to suppress an increase in sheet resistance of the channel formed at the interface between the channel layer 113 and the barrier layer 114.

Referring to FIG. 5, the heat resistance of the semiconductor device 100 according to the present embodiment is described more specifically. FIG. 5 is a graph illustrating an example of temperature dependency of sheet resistance of a channel in a HEMT in which the spacer layer 114A including AlN and the barrier layer 114 including $Al_{0.81}In_{0.19}N$ are stacked on the channel layer 113 including GaN.

As is apparent from FIG. 5, in a case where the composition ratio of In in the AlInN-based material included in the barrier layer 114 is higher than 18%, the sheet resistance of the channel formed at the interface between the channel layer 113 and the barrier layer 114 does not increase even if they are exposed to high temperatures of 750° C. and 800° C. That is, it can be considered that it is possible to suppress interdiffusion of atoms at the interface between the channel layer 113 and the barrier layer 114 by causing the composition ratio of In in the AlInN-based material included in the barrier layer 114 to be higher than 18%.

Therefore, in the semiconductor device 100 according to the present embodiment, it is possible to suppress the increase in sheet resistance of the channel by improving the heat resistance of the stack structure of the channel layer 113 and the barrier layer 114. In addition, the semiconductor device 100 according to the present embodiment is able to reduce the contact resistance of the contact layer 121 because it is possible to appropriately cause epitaxial growth of the contact layer 121 at a high temperature.

Specifically, with the semiconductor device 100 according to the present embodiment, it is possible to cause the sheet carrier concentration of the channel formed at the interface between the channel layer 113 and the barrier layer 114 to be $1 \times 10^{13}$ cm$^2$ or higher. This makes it possible to reduce the sheet resistance of the channel formed at the interface between the channel layer 113 and the barrier layer 114 down to 280 Ω/square or less. In addition, the semiconductor device 100 according to the present embodiment is able to reduce the contact resistance between the channel, formed at the interface between the channel layer 113 and the barrier layer 114, and the contact layer 121 down to 0.1 Ω·mm or less.

<3. Method of Manufacturing Semiconductor Device>

Next, referring to FIGS. 6 to 11, a method of manufacturing the semiconductor device 100 according to the present embodiment is described. FIGS. 6 to 11 are vertical cross-sectional views for describing respective processes of the method of manufacturing the semiconductor device according to the present embodiment.

First, as illustrated in FIG. 6, the buffer layer 112, the channel layer 113, and the barrier layer 114 are sequentially stacked on the substrate 111.

Specifically, a single-layer film or a stack film of a plurality of layers that includes at least one of AlN, AlGaN, or GaN is epitaxially grown on the substrate 111 including Si or the like, to thereby form the buffer layer 112. Thereafter, undoped GaN is epitaxially grown on the buffer layer 112 to thereby form the channel layer 113. Thereafter, $Al_{0.19}In_{0.81}N$ is epitaxially grown on the channel layer 113 to thereby form the barrier layer 114.

Thereafter, as illustrated in FIG. 7, a portion of the channel layer 113 and the barrier layer 114 are patterned to thereby provide an opening 121A in which the contact layer 121 is to be epitaxially grown in a later process.

Specifically, first, a mask 150 including $Si_3N_4$, $SiO_2$, $Al_2O_3$, or the like is formed on the barrier layer 114. Thereafter, a partial region of the channel layer 113, the barrier layer 114, and the mask 150 is removed by wet etching or dry etching using a patterned resist. As a result, the opening 121A is provided in the partial region of the channel layer 113 and the barrier layer 114.

Thereafter, as illustrated in FIG. 8, the contact layer 121 is selectively formed on the channel layer 113 inside the opening 121A, and the source or drain electrode 122 is formed on the contact layer 121. Thereafter, the element isolation layer 115 is formed in the channel layer 113 and the barrier layer 114.

Specifically, epitaxial growth of GaN is selectively caused on the channel layer 113 inside the opening 121A, to thereby form the contact layer 121. Note that in a case where a growth condition with low selectivity is used for forming the contact layer 121, a deposit formed on the mask 15 may be removed after forming the contact layer 121. Thereafter, an n-type impurity such as Si or Ge is ion-implanted into the contact layer 121 at a high concentration, to thereby provide conductivity to the contact layer 121. Thereafter, the mask 150 is removed by wet etching or dry etching, and Ti, Al, Ni, and Au are sequentially stacked on the contact layer 121 and the barrier layer 114, to thereby form the source or drain electrode 122. Thereafter, boron (B) is introduced into the barrier layer 114 and the channel layer 113 by ion implantation to increase the resistance of the barrier layer 114 and the channel layer 113. As a result, the element isolation layer 115 is formed.

In the semiconductor device 100 according to the present embodiment, it is possible to improve the heat resistance of the stack structure of the channel layer 113 and the barrier layer 114 by causing the composition ratio of In in the barrier layer 114 to be higher than 18%. Therefore, the semiconductor device 100 is able to suppress unclearness of the interface between the channel layer 113 and the barrier layer 114 caused by the heat generated in forming the contact layer 121. Accordingly, in the semiconductor device 100 according to the present embodiment, it is possible to form the contact layer 121 having contact resistance of a desired value, while suppressing an increase in sheet resistance of the channel formed at the interface between the channel layer 113 and the barrier layer 114.

Thereafter, as illustrated in FIG. 9, the first insulating layer 141 is uniformly formed on the source or drain electrode 122 and the barrier layer 114. For example, the first insulating layer 141 may be formed using $Si_3N_4$, or may be formed using a stack structure of a plurality of insulating materials.

Thereafter, as illustrated in FIG. 10, an opening is provided in a portion of the first insulating layer 141, and thereafter, the dielectric film 131 and the gate electrode 132 are formed. Specifically, after an opening is provided in the first insulating layer 141 in a region corresponding to the gate electrode 132, a film of $Al_2O_3$ is uniformly formed on the first insulating layer 141 and inside the opening, to thereby form the dielectric film 131. Further, Ni and Au are sequentially stacked on the dielectric film 131 inside the opening to thereby form the gate electrode 132.

Thereafter, as illustrated in FIG. 11, the second insulating layer 142 is formed on the first insulating layer 141 and the dielectric film 131. Thereafter, a portion of the first insulating layer 141, the dielectric film 131, and the second insulating layer 142 formed on the source or drain electrode 122 is removed, and thereafter, each wiring layer 123 electrically coupling to the source or drain electrode 122 is formed. For example, the second insulating layer 142 may be formed using $SiO_2$, or may be formed using a stack structure of a plurality of insulating materials. For example, the wiring layer 123 may be formed by sequentially stacking Ti, Al, Ni, and Au from the side of the source or drain electrode 122.

With the above-described processes, it is possible to manufacture the semiconductor device 100 according to the present embodiment.

<4. Application Examples of Semiconductor Device>

Further, referring to FIGS. 12 and 13, a description is given of a wireless communication apparatus to which the semiconductor device 100 according to the present embodiment is applied. FIG. 12 is a schematic perspective view for describing a wireless communication apparatus 1 which is a first application example of the semiconductor device according to the present embodiment. FIG. 13 is a block diagram for describing a wireless communication apparatus 6 which is a second application example of the semiconductor device according to the present embodiment.

As illustrated in FIG. 12, the wireless communication apparatus 1, which is the first application example, is an antenna-integrated module in which edge antennas 20 formed in an array on a substrate 50 and front end parts including, without limitation, a switch 10, a low noise amplifier 41, a band-pass filter 42, and a power amplifier 43 are mounted integrally as a single module. Such a wireless communication apparatus 1 can be used, for example, as a communication transceiver. The semiconductor device 100 according to the present embodiment may be applied to, for example, a transistor included in the switch 10, the low noise amplifier 41, the power amplifier 43, or the like. This makes it possible for the wireless communication apparatus 1 to further increase a gain with respect to a high-frequency signal.

As illustrated in FIG. 13, the wireless communication apparatus 6, which is the second application example, includes an antenna ANT, an antenna switch circuit 5, a high-power amplifier HPA, a radio-frequency integrated circuit RFIC (Radio Frequency Integrated Circuit), a baseband unit BB, an audio output unit MIC, a data output unit DT, and an interface unit I/F. Such a wireless communication apparatus 6 can be used as a mobile phone system having multiple functions including, without limitation, audio, data communication, and LAN connection, for example. The semiconductor device 100 according to the present embodiment may be applied to, for example, a transistor included in the antenna switch circuit 5, the high-power amplifier HPA, the radio-frequency integrated circuit RFIC, the baseband unit BB, or the like. This makes it possible for the wireless communication apparatus 6 to process a signal more efficiently.

The technology related to the present disclosure has been described above with reference to the embodiments and the modifications. However, the technology related to the present disclosure is not limited to the above-described embodiments and the like, and is modifiable in a variety of ways. For example, the embodiments and the modifications described above may be combined with each other.

Furthermore, not all of the configurations and the operation described in the respective embodiments are essential to the configurations and the operation of the present disclosure. For example, among the components in each embodiment, components not described in the independent claims describing the most superordinate concept of the present disclosure should be understood as optional components.

The terms used throughout the specification and the appended claims should be construed as "non-limiting" terms. For example, the terms "include" or "be included" should be construed as "not limited to the example described with the term included". The term "have" should be construed as "not limited to the example described with the term have".

The terms used herein include some terms that are used merely for convenience of description and are not used to limit the configuration and the operation. For example, the term such as "right," "left," "upper," or "lower" merely indicates a direction on the referred drawing. Further, the terms "inner" and "outer" merely indicate a direction toward the center of the component of interest and a direction away from the center of the component of interest, respectively. This similarly applies to terms similar to the above-described terms and terms having similar meanings.

Note that the technology related to the present disclosure may have the following configurations. According to the technology related to the present disclosure having the following configurations, the semiconductor device of the present embodiment is able to improve the heat resistance of the stack structure of the channel layer and the barrier layer. Therefore, in the semiconductor device according to the present embodiment, it is possible to form a contact layer having favorable contact resistance without increasing the sheet resistance of the channel formed at the interface between the channel layer and the barrier layer. Effects exerted by the technology related to the present disclosure are not necessarily limited to the effects described above, and may be any of the effects described in the present disclosure.

(1)
  A semiconductor device including:
    a channel layer including a GaN-based material;
    a barrier layer including an AlInN-based material in which a composition ratio of In is higher than 18%, the barrier layer being provided on the channel layer; and
    at least one contact layer including a conductive-type semiconductor material and provided to penetrate the barrier layer and reach the channel layer.

(2)
  The semiconductor device including:
    a channel layer including a GaN-based material;
    a spacer layer including an AlN-based material and provided on the channel layer;
    a barrier layer including an AlInN-based material in which a composition ratio of In is higher than 18%, the barrier layer being provided on the spacer layer; and
    at least one contact layer including a conductive-type semiconductor material and provided to penetrate the barrier layer and the spacer layer and reach the channel layer.

(3)
  The semiconductor device according to (1) or (2) described above, in which the contact layers are provided on two respective sides of a gate electrode with the gate electrode interposed therebetween, the gate electrode being provided on the barrier layer with a dielectric film interposed therebetween.

(4)
  The semiconductor device according to (3) described above, in which one of the contact layers provided with the gate electrode interposed therebetween is electrically coupled to a source electrode, and another of the contact layers provided with the gate electrode interposed therebetween is electrically coupled to a drain electrode.

(5)
  The semiconductor device according to (4) described above, in which sheet resistance between the gate electrode and the source electrode or the drain electrode is 280 Ω/square or less.

(6)
  The semiconductor device according to (4) or (5) described above, in which a sheet carrier concentration between the gate electrode and the source electrode or the drain electrode is $1.3 \times 10^{13}$ cm$^2$ or higher.

(7)
  The semiconductor device according to any one of (1) to (6) described above, in which contact resistance between the contact layer and a channel provided at an interface between the channel layer and the barrier layer is 0.1 Ω·mm or less.

(8)
  The semiconductor device according to any one of (1) to (7) described above, in which the contact layer includes an n-type GaN-based material as the conductive-type semiconductor material.

(9)
  The semiconductor device according to (8) described above, in which the n-type GaN-based material includes $2 \times 10^{20}$ cm$^{-3}$ or more of an n-type impurity.

(10)
  The semiconductor device according to any one of (1) to (9) described above, in which a carrier concentration of the contact layer is $8 \times 10^{19}$ cm$^{-3}$ or higher.

(11)
  The semiconductor device according to any one of (1) to (10) described above, in which the composition ratio of In in the barrier layer is 20% or lower.

(12)
  The semiconductor device according to (1) described above, in which the contact layer is provided in contact with an interface between the channel layer and the barrier layer.

(13)
  The semiconductor device according to (12) described above, in which the contact layer is provided in a region at a depth within 100 nm from a surface, of the barrier layer, on an opposite side to a surface, of the barrier layer, on a side provided with the channel layer.

(14)
  The semiconductor device according to (2) described above, in which the contact layer is provided in contact with an interface between the channel layer and the spacer layer.

(15)
  The semiconductor device according to (13) described above, in which the contact layer is provided in a region at a depth within 100 nm from a surface, of the barrier layer, on an opposite side to a surface, of the barrier layer, on a side provided with the spacer layer.

(16)
An electric circuit including
a semiconductor device including
a channel layer including a GaN-based material,
a barrier layer including an AlInN-based material in which a composition ratio of In is higher than 18%, the barrier layer being provided on the channel layer, and
at least one contact layer including a conductive-type semiconductor material and provided to penetrate the barrier layer and reach the channel layer.

(17)
A wireless communication apparatus including
a semiconductor device including
a channel layer including a GaN-based material,
a barrier layer including an AlInN-based material in which a composition ratio of In is higher than 18%, the barrier layer being provided on the channel layer, and
at least one contact layer including a conductive-type semiconductor material and provided to penetrate the barrier layer and reach the channel layer.

This application claims the priority on the basis of Japanese Patent Application No. 2019-210559 filed on Nov. 21, 2019 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
a channel layer including a GaN-based material;
a barrier layer including an AlInN-based material in which a composition ratio of In is higher than 18%, wherein the barrier layer is on the channel layer; and
at least one contact layer including a conductive-type semiconductor material, wherein
the at least one contact layer is positioned through the barrier layer and in contact with the channel layer,
the at least one contact layer is in a region at a depth within 100 nm from a first surface of the barrier layer that is on an opposite side to a second surface of the barrier layer, and
the second surface of the barrier layer is in contact with the channel layer.

2. The semiconductor device according to claim 1, wherein
the at least one contact layer includes a first contact layer and a second contact layer,
each of the first contact layer and the second contact layer is on a respective side of a gate electrode such that the gate electrode is between the first contact layer and the second contact layer,
the gate electrode is on the barrier layer, and
a dielectric film is between the gate electrode and the barrier layer.

3. The semiconductor device according to claim 2, wherein the first contact layer is electrically coupled to a source electrode, and the second contact layer is electrically coupled to a drain electrode.

4. The semiconductor device according to claim 3, wherein sheet resistance between the gate electrode and the source electrode, or between the gate electrode and the drain electrode, is one of 280 Ω/square or less.

5. The semiconductor device according to claim 3, wherein a sheet carrier concentration between the gate electrode and the source electrode, or between the gate electrode and the drain electrode, is one of $1.3 \times 10^{13}$ cm$^2$ or higher.

6. The semiconductor device according to claim 1, wherein contact resistance between the contact layer and a channel provided at an interface between the channel layer and the barrier layer is one of 0.1 Ω·mm or less.

7. The semiconductor device according to claim 1, wherein the contact layer includes an n-type GaN-based material as the conductive-type semiconductor material.

8. The semiconductor device according to claim 7, wherein the n-type GaN-based material includes one of $2 \times 10^{20}$ cm$^{-3}$ or more of an n-type impurity.

9. The semiconductor device according to claim 1, wherein a carrier concentration of the contact layer is one of $8 \times 10^{19}$ cm$^{-3}$ or higher.

10. The semiconductor device according to claim 1, wherein the composition ratio of In in the barrier layer is one of 20% or lower.

11. The semiconductor device according to claim 1, wherein the contact layer is in contact with an interface between the channel layer and the barrier layer.

12. A semiconductor device, comprising:
a channel layer including a GaN-based material;
a spacer layer including an AlN-based material, wherein the spacer layer is on the channel layer;
a barrier layer including an AlInN-based material in which a composition ratio of In is higher than 18%, wherein the barrier layer is on the spacer layer; and
at least one contact layer including a conductive-type semiconductor material, wherein
the at least one contact layer is positioned through the barrier layer and the spacer layer, and in contact with the channel layer,
the at least one contact layer is in a region at a depth within 100 nm from a first surface of the barrier layer that is on an opposite side to a second surface of the barrier layer, and
the second surface of the barrier layer is in contact with the spacer layer.

13. The semiconductor device according to claim 12, wherein the contact layer is in contact with an interface between the channel layer and the spacer layer.

14. An electric circuit, comprising:
a semiconductor device that includes:
a channel layer including a GaN-based material;
a barrier layer including an AlInN-based material in which a composition ratio of In is higher than 18%, wherein the barrier layer is on the channel layer; and
at least one contact layer including a conductive-type semiconductor material, wherein
the at least one contact layer is positioned through the barrier layer and in contact with the channel layer,
the at least one contact layer is in a region at a depth within 100 nm from a first surface of the barrier layer that is on an opposite side to a second surface of the barrier layer, and
the second surface of the barrier layer is in contact with the channel layer.

15. A wireless communication apparatus, comprising:
a semiconductor device including
a channel layer including a GaN-based material;

a barrier layer including an AlInN-based material in which a composition ratio of In is higher than 18%, wherein the barrier layer is on the channel layer; and at least one contact layer including a conductive-type semiconductor material, wherein
- the at least one contact layer is positioned through the barrier layer and in contact with the channel layer,
- the at least one contact layer is in a region at a depth within 100 nm from a first surface of the barrier layer that is on an opposite side to a second surface of the barrier layer, and
- the second surface of the barrier layer is in contact with the channel layer.

* * * * *